United States Patent
Kawashima et al.

(10) Patent No.: US 11,656,551 B2
(45) Date of Patent: May 23, 2023

(54) WATER-DEVELOPABLE PHOTOSENSITIVE RESIN COMPOSITION FOR FLEXOGRAPHIC PRINTING AND PHOTOSENSITIVE RESIN ORIGINAL PLATE FOR FLEXOGRAPHIC PRINTING OBTAINED THEREFROM

(71) Applicant: TOYOBO CO., LTD., Osaka (JP)

(72) Inventors: Wataru Kawashima, Okayama (JP); Jun Hasuike, Okayama (JP)

(73) Assignee: TOYOBO CO., LTD., Osaka (JP)

( * ) Notice: Subject to any disclaimer, the term of this patent is extended or adjusted under 35 U.S.C. 154(b) by 383 days.

(21) Appl. No.: 16/644,343

(22) PCT Filed: Aug. 31, 2018

(86) PCT No.: PCT/JP2018/032375
§ 371 (c)(1),
(2) Date: Mar. 4, 2020

(87) PCT Pub. No.: WO2019/049786
PCT Pub. Date: Mar. 14, 2019

(65) Prior Publication Data
US 2021/0063877 A1   Mar. 4, 2021

(30) Foreign Application Priority Data
Sep. 5, 2017   (JP) .............. JP2017-170178

(51) Int. Cl.
| | |
|---|---|
| G03F 7/037 | (2006.01) |
| B41N 1/12 | (2006.01) |
| C08G 69/14 | (2006.01) |
| G03F 7/11 | (2006.01) |

(52) U.S. Cl.
CPC .............. *G03F 7/037* (2013.01); *B41N 1/12* (2013.01); *C08G 69/14* (2013.01); *G03F 7/11* (2013.01)

(58) Field of Classification Search
None
See application file for complete search history.

(56) References Cited

U.S. PATENT DOCUMENTS

| | | | | |
|---|---|---|---|---|
| 4,188,221 A | * | 2/1980 | Nanpei ................. | G03F 7/037 522/100 |
| 4,716,094 A | | 12/1987 | Minonishi et al. | |
| 5,204,223 A | | 4/1993 | Taguchi et al. | |
| 5,284,735 A | * | 2/1994 | Okamoto ............... | G03F 7/031 430/920 |
| 6,127,094 A | * | 10/2000 | Victor .................... | G03F 7/033 430/935 |

FOREIGN PATENT DOCUMENTS

| | | | |
|---|---|---|---|
| EP | 1 596 253 | * | 11/2005 |
| EP | 1 767 994 | * | 3/2007 |
| EP | 1 939 687 | * | 7/2008 |
| JP | 60-191237 A | | 9/1985 |
| JP | 5-19459 A | | 1/1993 |
| JP | 9-288356 A | | 11/1997 |
| JP | 10-78657 A | | 3/1998 |
| JP | 2000-206677 A | | 7/2000 |
| JP | 2004-514159 A | | 5/2004 |
| WO | 02/19035 A1 | | 3/2002 |
| WO | 2016/043006 A1 | | 3/2016 |
| WO | 2017/159199 A1 | | 9/2017 |

OTHER PUBLICATIONS

International Search Report dated Nov. 27, 2018, issued in counterpart International Application No. PCT/JP2018/032375, with English Translation. (4 pages).

Extended (Supplementary) European Search Report dated Apr. 16, 2021, issued in counterpart EP Application No. 18852970 5. (7 pages).

* cited by examiner

*Primary Examiner* — Anca Eoff
(74) *Attorney, Agent, or Firm* — WHDA, LLP

(57) ABSTRACT

A photosensitive resin composition for a flexographic printing original plate is disclosed which exhibits reduced adhesion of dust, dirt, and paper powder, resistance to UV ink and allows storage of the printing original plate for a long period of time. A water-developable photosensitive resin composition for flexographic printing, contains at least a polyamide and/or a polyamide block copolymer (a), a cross-linking agent having one or more unsaturated group(s) (b), a photopolymerization initiator (c), and a fatty acid ester (d), wherein the fatty acid ester (d) has two or more hydroxyl groups and 24 or 25 carbon atoms in a molecule, wherein the fatty acid ester (d) is a fatty acid ester of a compound selected from fatty acids having a number of carbon atoms of 12 to 22, and wherein a content of the fatty acid ester (d) in the photosensitive resin composition is 0.2 to 6% by weight.

6 Claims, No Drawings

WATER-DEVELOPABLE PHOTOSENSITIVE RESIN COMPOSITION FOR FLEXOGRAPHIC PRINTING AND PHOTOSENSITIVE RESIN ORIGINAL PLATE FOR FLEXOGRAPHIC PRINTING OBTAINED THEREFROM

CROSS-REFERENCE TO RELATED APPLICATIONS

The present application is a national stage application filed under 35 U.S.C. 371 of International Application No. PCT/JP2018/032375, filed Aug. 31, 2018, and which is based upon and claims the benefit of priority from the prior Japanese Patent Application No. 2017-170178, filed on Sep. 5, 2017, the entire contents of which are incorporated herein by reference.

TECHNICAL FIELD OF THE INVENTION

The present invention relates to a water-developable photosensitive resin composition for flexographic printing and to a photosensitive resin original plate for flexographic printing which can suppress an adhesion of dust, dirt, paper powder, etc. to a relief and can prevent a partial printing loss. The present application has a relation to PCT/JP2017/005672 which was filed by the same Applicant as the present application. In the international search report of PCT/JP2017/005672, lack of support was pointed out. In response thereto, the Applicant excluded, from the right range of PCT/JP2017/005672, a case wherein the fatty acid ester (d) has two or more hydroxyl groups and 24 or 25 carbon atoms in a molecule, and wherein the fatty acid ester (d) is a fatty acid ester of a compound selected from fatty acids having a number of carbon atoms of 12 to 22. In the present application, the Applicant tries to obtain a right to the above case.

BACKGROUND ART

Up to now, a photosensitive resin printing plate which is common as a plate material for flexographic printing has been formed as follows. Firstly, an active ray is irradiated to a photosensitive resin which is used as a starting material whereby only a photosensitive layer in a relief part is cured by a radical polymerization reaction (exposing step). Then an uncured resin other than the relief part is removed by being dissolved in a predetermined washing solution (developing solution) or is mechanically removed by being swollen and dispersed (developing step). In this forming method, only a cured part appears on a plate surface as a relief. This forming method is preferably used because an ultrafine relief can be formed within a short time.

Among various photosensitive resin plates, a highly-hard plate using a polyamide-type photosensitive resin composition resists to an ink which forms a coat by irradiation of an ultraviolet ray. Accordingly, this highly-hard plate has been used in a printing application which uses a UV ink or a UV varnish. However, in a relief printing plate of low hardness which can be used for a flexographic printing, there is a problem of a surface adhesion caused by its softness. Accordingly, there is a problem of an adhesion of dust, dirt, paper powder, etc. to a surface of the printing plate.

When dust, dirt, paper powder, etc. generated during operations adhere to a plate surface of a relief in a printing step, a printing defect (printing loss) occurs. Here, the term reading the printing loss means a phenomenon that an ink is not transferred to a thing to be printed such as film or paper, and thus the ink cannot be applied on the thing but is lost. In addition, it is necessary to stop the printing step for a while in order to remove the paper piece or paper powder adhered to the plate surface. These problems result in an increase in an operation time, a decrease in a productivity and an increase in a production cost. Moreover, in recent years, a printing quality has been enhanced more and more. Accordingly, there has been a demand for a photosensitive resin printing plate which can reduce affections by the problems caused by the dust, dirt, and paper powder during the printing step.

In order to reduce the affections by the dust, dirt and paper powder, Patent Document 1 proposes a photosensitive resin composition consisting of a polyurethane prepolymer containing a specific benzoic acid derivative as an additive for decreasing an adhesion. In this document, it is described that this photosensitive resin composition is subjected to an exposing/developing treatment followed by being irradiated with a bactericidal radioactive ray whereby a relief surface becomes to be non-adhesive.

Further, Patent Document 2 proposes a method for providing a non-adhesive property to surfaces of many flexographic printing plates obtained by a manufacturing method containing a washing (developing) step and an alter-exposing step. This method uses a washing solution containing a hydrogen-abstracting agent (such as benzophenone). It is described in this document that, after an uncured resin is washed out using this washing solution, a radioactive ray which activates the hydrogen-abstracting agent (for example, a sterilizing ray or the like for benzophenone) is irradiated whereby the surface of the flexographic printing plate relief becomes to be non-adhesive.

In these methods, the additive for decreasing the adhesion is contained in the photosensitive resin composition or the washing solution, and the non-adhesive property is improved by irradiating an ultraviolet ray. However, there has been a risk that the effect varies depending upon an irradiating time of the ultraviolet ray. There is also a problem that an exposing time is dependent upon an adhesion of paper powder during a printing step (a phenomenon wherein, during the printing step, an ink or the paper powder or the like existing in a printing support or in an environment adheres to a relief whereby a printing loss is generated in that area).

In order to solve these problems, the applicant has proposed a method wherein an adhesive property of a relief surface of the flexographic printing plate is lowered by adding a long-chain fatty acid having carbon numbers within a specific range to the photosensitive resin composition (Patent Documents 3). In accordance with the method of Patent Document 3, it is possible to well lower the adhesive property of the relief surfaces of the flexographic printing plate. However, when a flexographic printing original plate having a photosensitive resin layer constituted from this photosensitive resin composition is stored for a long period of time, the long-chain fatty acid in the photosensitive resin composition is bled nut onto a surface of the photosensitive resin layer.

PRIOR ART DOCUMENTS

Patent Documents

Patent Document 1: Japanese Patent Application Laid-Open (JP-A) No. 2000-206677

Patent Document 2 Japanese Patent Application Laid-Open (JP-A) No. 288356/97
Patent Document 3: PCT/JP2015/074140

DISCLOSURE OF THE INVENTION

Problem that the Invention is to Solve

The present invention has been created for solving the problems in the above-mentioned prior art or, particularly, in the method of Patent Document 3. Its object is to provide a high-quality photosensitive resin composition for a flexographic printing original plate which not only exhibits a reduced adhesion of dust, dirt, and paper powder to a relief and a good resistance to a UV ink but also allows a long-tem storage of the printing original plate, even if this plate is a plate in a low hardness to be used for a flexographic printing.

Means for Solving the Problem

In order to achieve the above object, the inventors have conducted eager investigations. As a result, they have found that, when the fatty acid to be contained in the photosensitive resin composition of Patent Document 3 is modified by esterification so that hydroxyl groups exist in a molecule, an affinity for other ingredients in the photosensitive resin composition can be enhanced whereby a bleeding-out of the printing original plate during the storage for a long period of time can be effectively prevented while maintaining an ability of lowering the adhesive property of the relief surface of the flexographic printing plate. Consequently, they have accomplished the present invention.

Thus, the present invention consists of the constitutions of the following (1) to (5).

(1) A water-developable photosensitive resin composition for flexographic printing, characterized in that, it contains at least a polyamide and/or a polyamide block copolymer (a), a cross-linking agent having one or more unsaturated group (a) (b), a photo-polymerization initiator (c), and a fatty acid ester (d), wherein the fatty acid ester (d) has two or more hydroxyl groups and 24 or 25 carbon atoms in a molecule, wherein the fatty acid ester Cd) is a fatty acid ester of a compound selected from fatty acids having a number of carbon atoms of 12 to 22, and wherein a content of the fatty acid ester (d) in the photosensitive resin composition is 0.2 to 6% by weight.

2. The water-developable photosensitive resin composition for flexographic printing according to (1), wherein the photosensitive resin composition contains 40 to 60% by weight of the polyamide and/or the polyamide block copolymer (a), 20 to 50% by weight of the cross-linking agent having one or more unsaturated group(s) (b), and 0.1 to 10% by weight of the photo-polymerization initiator (c), and wherein the polyamide and/or the polyamide block copolymer (a) contain(s) in a molecule, 50% by weight or more of a structural unit constituted from an amide bond in a block form.

3. The water-developable photosensitive resin composition for flexographic printing according to (1) or (2), wherein the fatty acid ester (d) is sorbitan monooleate, sorbitan monostearate or glycerol monobehenate.

4. A photosensitive resin original plate for flexographic printing, characterized in that, it contains a photosensitive resin layer constituted from the water-developable photosensitive resin composition for flexographic printing mentioned in any of (1) to (3), a support and an adhesive layer for adhering them.

5. The photosensitive resin original plate for flexographic printing according to (4), wherein it is used for flexographic printing using a UV ink or a UV varnish.

Advantages of the Invention

The photosensitive resin composition for flexographic printing according to the present invention contains a specific amount of long-chain fatty acid ester having a hydroxyl group and specific numbers of carbon atoms in a molecule. Therefore, a photosensitive resin original plate formed by using it can significantly lower the adhesive property of the relief surfaces while maintaining a relief reproduction ability. As a result, dust, dirt, and paper powder are hardly adhered to the relief. Therefore, the printing loss hardly happens. In addition, the printing original plate can be stored for a long period of term. The photosensitive resin composition for flexographic printing according to the present invention is suitable particularly for a flexographic printing original plate using a UV ink or a UV varnish.

BEST MODE FOR CARRYING OUT THE INVENTION

Hereinafter, the photosensitive resin composition for flexographic printing according to the present invention will be mentioned in detail. The photosensitive resin original plate for flexographic printing of the present invention contains a photosensitive resin layer constituted from the photosensitive resin composition for flexographic printing of the present invention, an adhesive layer and a support. The adhesive layer is arranged between the support and the photosensitive resin layer so as to enhance their adhesive property.

The support to be used for the photosensitive resin original plate of the present invention is preferably made from a material being flexible and having a superior dimension stability. Examples thereof include a support made of metal, such as steer, aluminum, copper and nickel, and a support made of a thermoplastic such as a polyethylene terephthalate film, a polyethylene naphthalate film, a polybutylene terephthalate film and a polycarbonate film. Among these, the polyethylene terephthalate film, which has a support dimension stability and a sufficiently high viscoelasticity, is in particular preferably used. A thickness of the support is set to 50 to 350 μm, preferably, to 100 to 250 μm, from viewpoints of mechanical properties, shape stability and handling characteristics upon producing a printing plate.

The adhesive layer used for the photosensitive resin original plate of the present invention is arranged between the support and the photosensitive resin layer so as to bind the both. The adhesive layer may be formed from a single layer or may be formed from a plurality of layers. In addition, it is preferred that the adhesive layer contains a binder ingredient and a pigment and that it further contains a leveling agent and a curing agent.

As to the binder ingredient to be used in the adhesive layer, there may be exemplified polyester resin, epoxy resin, polyamide resin, polyimide resin, phenol resin, butadiene, rein, poly-urethane resin and polystyrene-polyisoprene copolymer resin. Each of them may be used solely or they may be used by mixing. Particularly preferred binder ingredient among them is polyester resin or polyurethane resin in view of a resistance to solvents.

The photosensitive resin layer used for the photosensitive resin original plate of the present invention is constituted from the photosensitive resin composition of the present invention. The photosensitive resin composition of the present invention is constituted from a polyamide and/or polyamide block copolymer (a), a cross-linking agent having one or more unsaturated group(s) (b), a photo-polymerization initiator (c), and a fatty acid ester (d) having hydroxyl groups in a molecule. The photosensitive resin composition may contain other additives such as thermal polymerization preventer, plasticizer, dye, pigment, perfume or antioxidant in addition to the ingredients (a)-(d).

As to the polyamide and/or the polyamide block copolymer (a), it/they may be a polymer compound containing, in a molecule, 50% by weight or more, preferably 70% by weight or more of a structural unit constituted from an amide bond in block form. Examples thereof are polyether amide, polyether ester amide, tertiary nitrogen-containing polyamide, tertiary nitrogen-containing polyamide of an ammonium salt type and an addition polymerization product of an amide compound having one or more amide bond(s) and an organic diisocyanate compound. Among them, the tertiary nitrogen-containing polyamide of an ammonium salt type is preferred. When the tertiary nitrogen-containing polyamide and the tertiary nitrogen-containing polyamide of an ammonium salt type are used, a developing property is enhanced by adding an organic acid. As to the organic acid, there may be exemplified acetic acid, lactic acid and methacrylic acid although they are not limitative.

The polyamide block copolymer of the present invention may also contain an urea bond and/or an urethane bond besides the amide bond. Generally speaking, a UV ink uses a component ingredient similar to the photosensitive resin composition used for a printing original plate whereby a resistance of the photosensitive resin layer to a UV ink is poor. However, according to the present invention, it is possible to enhance the resistance to a UV ink by using, in the photosensitive resin layer, the polyamide and/or polyamide block copolymer having an amide bond in a molecule. Rate of the ingredient (a) in the photosensitive resin composition is preferred to be 40 to 60% by weight. In addition, it is preferred that the polyamide block copolymer is polyalkylene glycol because it can impart a softness. As to the specific alkylene glycol, polyethylene glycol and copolymers thereof may be exemplified.

As to the cross-linking agent having one or more unsaturated group(s), there may be exemplified a product by an addition reaction of dipentaerythritol, pentaerythritol, trimethylolpropane glycerol, ethylene glycol, diethylene glycol, triethylene glycol or phthalic acid with ethylene oxide; a product by an addition reaction of bisphenol A or bisphenol F with diglycidyl ether acrylic acid; a product by an addition reaction of polyvalent glycidyl ether (such as ethylene glycol di(meth)acrylate, neopentyl glycol di(meth)acrylate, glycerol di(meth)acrylate, trimethylolpropane tri(meth)acrylate, pentaerythritol penta(meth)acrylate or dipentaerythritol penta(meth)acrylate) with (meth)acrylic acid; a product by an addition reaction of polycarboxylic acid such as adipic acid with glycidyl (meth)acrylate; and a product by an addition reaction of polyvalent amine such as propylenediamine with glycidyl (meth)acrylate although they are not limitative. As to the ingredient (b), there may be used not only a single type compound but also a mixture of two or more. Rate of the ingredient (b) in the photosensitive resin composition is preferred to be 20 to 50% by weight.

As to the photopolymerization initiator (c) examples thereof are benzophenones, benzoin, acetophenones, benzyls, benzoin alkyl ethers, benzyl alkyl ketals, anthraquinones and thioxanthones. Specific examples thereof are benzophenone, chlorobenzophenone, benzoin, acetophenone, benzyl, benzoin methyl ether, benzoin ethyl ether, benzoin isopropyl ether, benzoin isobutyl ether, benzyl dimethyl ketal, benzyl diethyl ketal, benzyl diisopropyl ketal, anthraquinone, 2-ethylanthraquinone, 2-methylthraquinone, 2-allylanthraquinone, 2-chloroanthraquinone, thioxanthone and 2-chlorothioxanthone. Rate of the ingredient (c) in the photosensitive resin composition is preferred to be 0.1 to 10% by weight.

The fatty acid ester (d) has two or more hydroxyl groups and 24 or 25 carbon atoms in a molecule, and is a fatty acid ester of a compound selected from fatty acids having a number of carbon atoms of 12 to 22. To be more specific, as to the fatty acid ester (d), there may be used a fatty acid ester prepared from a polyhydric alcohol containing two or more hydroxyl groups and a fatty acid having a number of carbon atoms of 12 to 22, in Patent Document 3, a fatty acid per se is used as an adhesive property-lowering agent for a relief surface of a flexographic printing plate. On the contrary, in the present invention, a fatty acid is modified by means of esterification so that a hydroxyl group is contained in a molecule. As a result, an affinity for other ingredients in the photosensitive resin composition is enhanced whereby a bleeding-out of the printing original plate during the storage for a long period of time is effectively prevented while maintaining an ability of lowering the adhesive property on the relief surface of the flexographic printing plate.

As to the polyhydric alcohol used for the fatty acid ester, there may be exemplified glycerol, trimethylolpropane, sorbitan, sorbitol and polyglycerol. Although there is no particular limitation for an upper limit of a number of the hydroxyl group in the polyhydric alcohol, it is usually 10 or less. In addition, the fatty acid used for the fatty acid ester is a compound selected from the fatty acids having a number of carbon atoms of 12 to 22. To be more specific, the preferred ones are lauric acid, myristic acid, palmitic acid, margaric acid, stearic acid, arachidic acid and behenic acid. More preferred ones are palmitic acid, margaric acid, stearic acid, arachidic acid and behenic acid which have a number of carbon atoms of 16 to 22. When the number of carbon atoms is less than the above range, it is not possible to reduce the adhesive property. When the number of carbon atoms is more than the above range, although reduction of the adhesive property is possible, a transparency of the plate is lost, and thus a depth of the relief after exposure and development (a depth of a slit pattern) becomes shallow whereby a reproducibility of the relief is significantly deteriorated. Rate of the ingredient (d) in the photosensitive resin composition is 0.2 to 6% by weight and preferably 0.4 to 5% by weight. When the rate of the ingredient (d) is less than the above range, it is not possible to reduce the adhesive property. When the rate of the ingredient (d) is more than the above range, although reduction of the adhesive property is possible, a transparency of the plate is lost, and thus a depth of the relief after exposure and development (a depth of a slit pattern) becomes shallow whereby a reproducibility of the relief is significantly deteriorated. As to each of the polyhydric alcohol and the fatty acid, not only a single compound but also a mixture of two or more may be used.

As to the fatty acid ester prepared from the above-mentioned polyhydric alcohol and the above-mentioned fatty acid, there may be specifically exemplified glycerol monobehenate, sorbitan monostearate, and sorbitan monooleate.

The thermal polymerization inhibitor is used in order to enhance a thermal stability of the photosensitive resin layer. As to the thermal polymerization inhibitor, there are exemplified hydroquinones, benzoquinones, phenols, catechols, aromatic amine compounds, picric acids, phenothiazine, α-naphthoquinones, anthraquinones nitro compounds and sulfur compounds. An amount of the thermal polymerization inhibitor used therefor is preferably 0.001 to 2% by weight and more preferably 0.005 to 1% by weight in the photosensitive resin composition. As to these compounds, not only a single compound but also a mixture of two or more may be used.

In the present invention, it is preferable to add a plasticizer to the photosensitive resin composition so as to enhance flexibility of the photosensitive resin composition. As to the plasticizer, it is preferable to use a compound exhibiting good compatibility with the polyamide resin. Specifically, there are exemplified polyhydric alcohol such as ethylene glycol, propylene glycol, 1,4-butanediol, 1,2-butanediol, diethylene glycol, triethylene glycol, glycerol, trimethylolpropane, trimethylolethane; N-ethyl-toluensulfonic amide N-buthyl-benzene sulfonic amide, and N-methyl-benzene sulfonic amide. Among them, polyhydric alcohol is preferable because it can more enhance the flexibility of the photosensitive resin composition. Diethylene glycol and 1,2-butanediol are particularly preferable. An amount of the plasticizer used therefor is preferably 30% by weight or less in the photosensitive resin composition. As to these compounds, not only a single compound but also a mixture of two or more may be used.

A thickness of the photosensitive resin layer is preferred to be 0.1 to 10 mm. When the thickness of the photosensitive resin layer is small, a relief depth necessary for using as a printing plate material may not be achieved while, when the thickness is large, a weight of the printing plate material is suppressed and a deficiency may be resulted in a practical handling.

The photosensitive resin composition can be molded into the photosensitive resin layer by means of any of known methods such as a melt molding, a heat press, a casting, a fused extrusion or a solution casting.

The photosensitive resin original plate can be prepared by layering the photosensitive resin layer molded into a sheet form on a support via an adhesive layer. When the photosensitive resin layer in the sheet form is layered on the support and supplied in a form of a layered product, it is preferred that a protective layer (cover film) is further layered on the photosensitive resin layer. As to the protective layer, a plastic film may be used. An example thereof is a polyester film in 125 μm thickness applied with a transparent polymer which has no tackiness and which can be dispersed or dissolved in a developer, in a thickness of 1 to 3 μm. By arranging such protective layer having a thin polymer coat on the photosensitive resin layer, it is possible to easily detach the protective layer in a subsequent exposing operation, even when a surface adhesive property of the photosensitive resin layer is strong.

In the photosensitive resin original plate having such layer constitution, a negative film or positive film having a transparent image part is layered by close adhesion to the photosensitive resin layer. Then, an active ray is irradiated from an upper side to expose whereby only an exposed part is insolubilized and cured. As to a light source of the active ray, it is preferable to use a light source such as a high-pressure mercury lamp, an ultrahigh-pressure mercury lamp, a metal halide lamp, a xenon lamp or a chemical lamp which mainly emits a light in a wavelength of 300 to 450 nm.

Then, a non-exposed part is removed by dissolving in an appropriate solvent or, particularly in neutral water whereby a printing plate having a clear image part is obtained. In order to remove the non-exposed part, it is possible to use a developing system such as a spray-type developing apparatus or a brush-type developing apparatus.

EXAMPLES

Advantageous effects caused by the photosensitive resin composition of the present invention will now be illustrated by way of Examples as hereunder although the present invention shall not be limited thereto. A term "part(s)" in Examples (text) stand(s) for parts) by weight. A numerical value which shows a composition rate in Table stands for part(s) by weight.

Preparation of a Polymer Compound 1

ε-Caprolactam (50 parts), 56 parts of N,N'-bis(γ-aminopropyl)piperazine adipate, 6.3 parts of 1,3-bisaminomethyl-cyclohexane adipate and 10 parts of water were charged in a reactor. After a sufficient substitution with nitrogen was done, the reactor was closed tightly and heated gradually. As from a stage wherein an inner pressure reached 10 kg cm$^2$, water in the reactor was gradually distilled and the pressure was returned to an ordinary pressure within 1 hour. After that, a reaction was carried out for 1.0 hour at the ordinary pressure. The highest polymerization temperature was 220° C. As a result thereof, a transparent, light yellow and alcohol-soluble oligomer having a specific viscosity of 1.5 was obtained. In this oligomer, both terminals were substantially primary amino groups, amide bonds were bound in a block form, and number-average molecular weight was about 3,000. After 46 parts of this oligomer was dissolved in 200 parts of methanol, 9 parts of an organic diisocyanate compound substantially having isocyanate groups in both terminals was gradually added thereto with stirring. (This organic diisocyanate compound has been previously prepared by reacting 1000 parts of polypropylene glycol (weight-average molecular weight: 1000) with 369 parts of hexamethylene diisocyanate.) Reaction of the both finished within about 15 minutes at 65° C. The resulting solution was taken onto a Petri dish coated with Teflon (registered trade mark). After a removal of methanol by evaporation, the residue was dried in vacuo to give a polyamide block copolymer (a polymer compound 1). This polyamide block copolymer has the specific viscosity of 2.0, and contains 82% by weight of a block ingredient of the structural unit constituted from an amide bond, and further contains an urea bond and an urethane bond in addition to amide bond.

Preparation of a Polymer Compound 2

ε-Caprolactam (50 parts) 56 parts of N,N'-bis(γ-aminopropyl)piperazine adipate, 6.3 parts of 1,3-bisaminomethyl-cyclohexane adipate and 10 parts of water were charged in a reactor. After a sufficient substitution with nitrogen was done, the reactor was closed tightly and heated gradually. As from a stage wherein an inner pressure reached 10 kg/cm$^2$, water in the reactor was gradually distilled and the pressure was returned to an ordinary pressure within 1 hour. After that, a reaction was carried out for 1.0 hour at the ordinary pressure. The highest polymerization temperature was 220° C. As a result thereof, a transparent, light yellow and alcohol-soluble oligomer having a specific viscosity of 1.5 was obtained. In this oligomer, both terminals were substantially primary amino groups, amide bonds were bound in a block form, and number-average molecular weight was about 3,000. After 46 parts of this oligomer was dissolved in 200 parts of methanol, 5 parts of an organic diisocyanate compound substantially having isocyanate groups in both terminals was gradually added thereto with stirring. (This organic diisocyanate compound has been previously prepared by reacting 400 parts of polyethylene glycol (weight-average molecular weight: 400) with 369 parts of hexamethylene diisocyanate.) Reaction of the both finished within about 15 minutes at 65° C. The resulting solution was taken onto a Petri dish coated with Teflon (registered trade mark). After a removal of methanol by evaporation, the residue was dried in vacuo to give a polyamide block copolymer (a polymer compound 2). This polyamide block copolymer has the specific viscosity of 2.1, and contains 90% by weight of a block ingredient of the structural unit constituted from an amide bond, and further contains an urea bond and an urethane bond in addition to amide bond.

Preparation of a Polymer Compound 3

ε-Caprolactam (55 parts), 40 parts of N,N'-bis(γ-aminopropyl)piperazine adipate, 7.5 parts of 1,3-bisaminomethyl-cyclohexane adipate and 100 parts of water were charged in a reactor. After a sufficient substitution with nitrogen was done, the reactor was closed tightly and heated gradually. As from a stage wherein an inner pressure reached 10 kg/cm$^2$, water in the reactor was gradually distilled and the pressure was returned to an ordinary pressure within 1 hour. After that, a reaction was carried out for 1.0 hour at the ordinary pressure whereby polyamide (a polymer compound 3) was obtained. This polyamide has the specific viscosity of 2.4, and consists of amide bond only.

Preparation of a Support

Dihydrothio-p-toluidine (0.5 part) as an ultraviolet absorber was dissolved in 3.6 parts of dimethylamine acetamide while, as a polyester resin solution, 100 parts of "Vylon 30 SS" product of Toyobo; solid concentration: 30%; molecular weight: 20000 to 25000) and 0.2 part of "U-CAT SA 102" (a product of San-Agro Ltd.; a composition of DBU octylate) as a catalyst were dissolved in 0.7 part of dioxane. After that, 10.2 parts of "Coronate L" (a product of Nippon Polyurethane Industry) as a multifunctional isocyanate was dissolved in 1.4 parts of ethyl acetate to give a solution of an adhesive composition. This solution was uniformly applied onto a transparent polyester film support having 188 μm thickness followed by drying at 120° C. for 1 minute using a hot-air drier to give a support having a transparent adhesive layer of 20 μm coat thickness.

Preparation of a Cover Film

Film of polyvinyl alcohol (AH-25 manufactured by Nippon Synthetic Chemical) in 2 μm thickness was coated on polyester film in 125 μm thickness whereupon a cover film was prepared.

Example 1

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of glycerol monobehenate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained.

Preparation of Photosensitive Resin Plate

The above photosensitive resin composition was flown onto the adhesive layer of the above support. The above cover film was applied to the photosensitive resin composition in such a manner that a coated side of the cover film contacts with the photosensitive resin composition to prepare a photosensitive resin plate in a sheet-form layered product wherein a total thickness of the layered product was 1390 μm and a thickness of the photosensitive resin layer was 932 μm. Details of the photosensitive resin composition and evaluation results thereof are shown in Table 1.

Example 2

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of sorbitan monostearate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 3

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of sorbitan monooleate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 4

Preparation of Photosensitive Resin Composition

The above polymer compound 1 (55 parts) was dissolved in 100 parts of methanol with heating at 65° C. Then, 9.0 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 1 part of glycerol monobehenate, 1 part sorbitan monooleate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same Procedure as Example 1. Details of the photosensitive resin composition and evaluation results thereof are shown in Table 1.

Example 5

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 0.3 part of sorbitan monostearate, 5 parts of lactic acid, 18 parts of water, 1 part of benzyl dimethylketal as a photo-polymerization initiator and 29.7 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 6

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 0.6 part of sorbitan monostearate, 5 parts of lactic acid, 18 parts of water, 1 part of benzyl dimethylketal as a photo-polymerization initiator and 29.4 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 7

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 1 part of sorbitan monostearate, 5 parts of lactic acid, 18 parts of water, 1 part of benzyl dimethylketal as a photo-polymerization initiator and 29 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 8

Preparation of Photosensitive Resin Composition

The above polymer compound 1 (55 parts) was dissolved in 100 parts of methanol with heating at 65° C. Then, 7 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 5 parts sorbitan monostearate, 5 parts of lactic acid, 18 parts of water, 1 part of benzyl dimethylketal as a photo-polymerization initiator and 27 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 9

Preparation of Photosensitive Resin Composition

The above polymer compound 2 (55 parts) was dissolved in 100 parts of methanol with heating at 65° C. Then, 9 arts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of sorbitan monostearate, 5 parts of lactic acid, 18 parts of water, 1 part of benzyl dimethylketal as a photo-Polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil met an and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 10

Preparation of Photosensitive Resin Composition

The above polymer compound 3 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of sorbitan monostearate, 5 parts of lactic acid, 18 parts of water, 1 part of benzyl dimethylketal as a photo-Polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 11

Preparation of Photosensitive Resin Composition

The above polymer compound 1 (50 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 5 parts of sorbitan monostearate, 5 parts of lactic acid, 18 parts of water, 1 part of benzyl dimethylketal as a photo-polymerization initiator and 30 parts of an adduct of glycerine diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 12

Preparation of Photosensitive Resin Composition

The above polymer compound 1 (50 parts) was dissolved in 100 parts of methanol with heating at 65° C. Then, 9 parts of diethylene glycol as a plasticizer, 0.001 part of 1,4-naphthoquinone and 0.1 part of hydroquinone monomethyl ether were added thereto and dissolved by stirring for 30 minutes. After that, 4 parts of sorbitan monostearate, 5 parts of lactic acid, 18 parts of water, 1 part of benzyl dimethylketal as a photo-polymerization initiator and 31 parts of an adduct of glycerine diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Example 13

Preparation of Photosensitive Resin Composition

The above polymer compound 1 (50 parts) was dissolved in 100 parts of methanol with heating at 65° C. Then, 9 parts of 1,2-butanediol as a plasticizer, 0.001 part of 1,4-naphthoquinone and 0.1 part of hydroquinone monomethyl ether were added thereto and dissolved by stirring for 30 minutes. After that, 6 parts of sorbitan monostearate, 5 parts of lactic acid, 18 parts of water, 1 part of benzyl dimethylketal as a photo-polymerization initiator and 29 parts of an adduct of glycerine diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Comparative Example 1

Preparation of Photosensitive Resin Composition

The above polymer compound 1 (55 parts) was dissolved in 100 parts of methanol with heating at 65° C. Then, 11 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 5 parts of lactic acid, 18 parts of water, 1 part of benzyl dimethylketal as a photo-polymerization initiator and 28 arts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Comparative Example 2

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 3 parts of stearic acid, 4 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Comparative Example 3

Preparation of Photosensitive Resin Composition

The above polymer compound 2 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 3 parts of EXCEPARL MY-M (manufactured by Kao Corporation: myristyl myristate), 4 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1, Details of the photosensitive resin composition and evaluation results thereof are shown in Table 1.

Comparative Example 4

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of glycerol monolignocerate, 5 parts of lactic acid, 18 parts of water, 1 part of benzyl dimethylketal as a photo-Polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Comparative Example 5

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that 2 parts of glycerol monocaprate, 5 parts of lactic acid, 18 parts of water, 1 part of benzyl dimethyl ketal as a photo-polymerization initiator and 28 parts of an adduct of propylene glycol diglycidyl ether with acrylic acid as a photo-polymerizable unsaturated compound were added thereto and dissolving by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Comparative Example 6

Preparation of Photosensitive Resin Composition

The above polymer compound 1 (55 parts) was dissolved in 100 parts of methanol with heating at 65° C. Then, 6 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 8 parts sorbitan monostearate, 5 parts of lactic acid, 18 parts of water, 1 part of benzyl dimethylketal as a photo-polymerization initiator and 25 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Comparative Example 7

Preparation of Photosensitive Resin Composition

To 100 parts of water and 10 parts of toluene, NBR latex (manufactured by Zeon Corporation: Nipol LX531B) was added so that a solid content thereof becomes to be 55 parts. Then, 9.0 parts of N-ethyl-toluenesulfonic amide as a plasticizer, 0.001 part of 1,4-naphthoquinone, 0.1 part of hydroquinone monomethyl ether, 2 parts of sorbitan monostearate, 5 parts of lactic acid, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was kneaded and water content was removed by using a kneader to obtain a solid photosensitive resin composition.

Referential Example 1

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of glycerol monostearate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Referential Example 2

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of glycerol monopalmitate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Referential Example 3

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of glycerol monolaurate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Referential Example 4

Preparation of Photosensitive Resin Composition

The above polymer compound 1 (55 parts) was dissolved in 100 parts of methanol with heating at 65° C. Then, 9 parts of N-ethyl-toluenesulfonic amide as a plasticizer, 0.001 part of 1,4-naphthoquinone and 0.1 part of hydroquinone monomethyl ether were added thereto and dissolved by stirring for 30 minutes. After that, 2 parts of glycerol monomyristate, 5 parts of lactic acid, 18 parts of water, 1 part of benzyl dimethylketal as a photo-polymerization initiator and 28 parts of an adduct of propylene glycol diglycidyl ether with acrylic acid as a photo-polymerizable unsaturated compound were added thereto and dissolved by stirring for 30 minutes. Then, the mixture was gradually heated to distil methanol and water and concentrated until a temperature in a container reached 110° C. In this stage, a viscous photosensitive resin composition having fluidity was obtained. The photosensitive resin plate was prepared in the same procedure as Example 1. Details of the photosensitive resin composition and evaluation results thereof are shown in Table 1.

Preparation of Photosensitive Resin Plate

The above photosensitive resin composition was arranged on the adhesive layer of the above support. The above cover film was applied to the photosensitive resin composition in such a manner that a coated side of the cover film contacts with the photosensitive resin composition and subjected to a heatpress at 100° C. to prepare a photosensitive resin plate in a sheet-form layered product wherein a total thickness of the layered product was 1390 µm and a thickness of the photosensitive resin layer was 932 µm. Details of the photosensitive resin composition and evaluation results thereof are shown in Table 1.

Evaluation of Developing Property

A non-exposed plate was developed by using tap water as a developing solution and a brush-type washer (Nylon brush of 120 µm diameter; Model JW-A2-PD manufactured by Nippon Denshi Seiki). A developing property was evaluated taking a developing time at 30° C. as an index.

Evaluation result was mentioned in accordance with the following criteria.

○: a case wherein the plate could be developed within 3 minutes

Δ: a case wherein the plate could be developed within 5 minutes and more than 3 minutes x: a case wherein the plate could not be developed within 7 minutes xx: a case wherein the Late could not be developed with tap water

Evaluation of Relief Image Reproducibility

After a non-exposed plate was stored for 7 days or longer under an environment of 25° C., a polyester film of 125 µm was peeled off therefrom, and a test negative film was tightly adhered thereto in vacuo. Then, an active ray (light source:

Philips 10 R; illuminance at 365 nm: 9 mw/cm$^2$) was irradiated from a position at a distance of 5 cm height from the photosensitive resin surface with an exposing time by which a step guide showed 16 steps.

Details of an image of the tested negative film were as follows.

Halftone dots: 150 lines, 2% to 95%

Independent points: points of 200 μm or 300 μm diameters

Independent fine lines: lines of 40 μm or 50 μm

Relief depth: line of 300 μm slit width

Step guide: a gray scale negative film for measuring a sensitivity

After that, the plate was developed at 30° C. by using tap water as a developing solution and a brush-type washer (Nylon brush of 120 μm diameter; Model JW-A2-PD manufactured by Nippon Denshi Seiki to give a relief image. In such a case wherein the plate could not be developed with tap water in the above evaluation for the developing property, a soap solution of pH 11 using soap powder (soap powder of Shizenmaru) was used as a developing solution and the plate was developed at 40° C. whereupon a relief image was obtained. After obtaining the relief image in this way, it was further dried with warm current of air for 10 minutes at 70° C. Then a relief was obtained by an after-exposure for 2 minutes using the same chemical ray, and was evaluated. In the evaluation result, an evaluation was conducted for halftone dots, independent points and independent fine lines wherein the image in the above part of the relief was reproduced without any lacking and/or twisting.

Evaluation result was mentioned in accordance with the following criteria.

○: a case wherein the image did not have any lacking and/or twisting, wherein the halftone dots, independent points and independent fine lines were reproduced and wherein the slit depth in 300 μm slit width was reproduced in 50 μm or more x: a case wherein the image did not have any lacking and/or twisting, wherein the halftone dots, independent points and independent fine lines were not reproduced and wherein the slit depth in 300 μm slit width was reproduced in less than 50 μm Evaluation of Rolling of Spherical Body After a non-exposed plate was stored for 7 days or longer, a polyester film of 125 μm was peeled off therefrom, and a negative film having a solid image of 150×100 mm (a fully exposable image of 150×100 mm) was tightly adhered thereto in vacuo. Then, an active ray (light source: Philips 10 R; illuminance at 365 nm: 9 mW/cm$^2$) was irradiated from a position at a distance of 5 cm height from the photosensitive resin surface with an exposing time by which a step guide showed 16 steps. After that, the plate was developed at 30° C. by using tap water as a developing solution and a brush-type washer (Nylon brush of 120 μm diameter; Model JW-A2-PD manufactured by Nippon Denshi Seiki) give a relief image. In such a case wherein the above developing property was evaluated as "x", methanol which was used for the preparation of the photosensitive resin composition was used as a developing solution and the plate was developed at 20° C. by using a Nylon brush of 120 μm diameter. After that, it was dried with warm current of air for 10 minutes at 70° C. Then, a relief for printing was obtained by an after-exposure for 2 minutes using the same chemical ray. In such a case wherein the above developing property was evaluated as "xx", toluene which was used for the preparation of the photosensitive resin composition was used as a developing solution and the plate was developed at 20° C. by using a Nylon brush of 120 μm diameter. After that, it was dried with warm current of air for 10 minutes at 70° C. Then, a relief for printing was obtained by an after-exposure for 2 minutes using the same chemical ray.

An adhesive layer film side of the prepared relief was adhered to an iron plate using a double-sided adhesive tape. Then, the relief was mounted in an inclined manner with an angle of inclination of 5°. After that, a spherical body made of steel in 11 mm diameter and 5.5 g weight was placed on a surface of an upper side of the relief. A time necessary for the spherical body to roll for 120 mm was measured and evaluated.

Evaluation result was mentioned in accordance with the following criteria.

○: a case wherein the spherical body rolled within 3 seconds

Δ: a case wherein within the spherical body rolled within more than 3 seconds to 10 seconds x: a case wherein it took 10 seconds or more for the rolling of the spherical body Evaluation of Printing Property After a non-exposed plate was stored for 7 days or longer, a polyester film of 125 μm was peeled off therefrom, and a negative film having a solid image of 150×100 mm (a fully exposable image of 150×100 mm) was tightly adhered thereto ire vacuo. Then, an active ray (light source: Philips 10 R; illuminance at 365 nm: 9 mW/cm$^2$) was irradiated from a position at a distance of 5 cm height from the photosensitive resin surface with an exposing time by which a step guide showed 16 steps. After that, the plate was developed at 30° C. by using tap water as a developing solution and a brush-type washer (Nylon brush of 120 μm diameter; Model JW-A2-PD manufactured by Nippon Denshi Seiki to give a relief image. In such a case wherein the above developing property was evaluated as "x", methanol which was used for the preparation of the photosensitive resin composition was used as a developing solution and the plate was developed at 20° C. using a Nylon brush of 120 μm diameter. After that, it was dried with warm current of air for 10 minutes at 70° C. Then, a relief for printing was obtained by an after-exposure for 2 minutes using the same chemical ray.

An omission of solid printing was evaluated by a flexographic printer (FPR 302 manufactured by MCK Co., Ltd.) using Bestcure (manufactured by T&K TOKA) as an ink and Raicho Coat (manufactured by Chuetsu Pulp) as a printing paper. Printing condition was as follows. Thus, as to an anilox, anilox roll of 800 lines was used. As to a cushion sheet, SA 3120 LL 18 (manufactured by Rogers Corp.) was used. A printing pressure (a distance for pushing the relief into paper) was adjusted so as to make a solid ink concentration 1.6 abs. A printing speed was adjusted to 40 m/minute. A number of the printing omission in printed matters when a 1000-shot printing was done were evaluated.

Evaluation result was mentioned in accordance with the following criteria.

○: a case wherein a number of omission was less than 5

Δ: a case wherein a number of omission was 5 or more to less than 10 x: a case wherein a number of omission was 10 or more

Evaluation for Stability During Storage

There were prepared a sample A wherein a non-exposed plate was stored for 7 days under an environment of 25° C.

and a sample B wherein a non-exposed plate was stored for 90 days under an environment of 55° C. followed by storing for 7 days under an environment of 25° C. They were evaluated for a stability during a storage.

Firstly, the sample B, it was confirmed whether a bleeding-out was noted on a surface layer upon peeling off a polyester film of 125 µm.

Evaluation result was mentioned in accordance with the following criteria.

∘: a case wherein no bleeding-out was noted
x: a case wherein bleeding-out was noted Further, in order to confirm an adhesive property, a relief was prepared for each of the stored samples under the same condition for the evaluation of relief image reproducibility. After being prepared, the relief was dipped in a solvent (methyl ethyl ketone) for six hours and it was confirmed whether a peeling-off was resulted in a relief image. Incidentally, when the reproducibility of the relief image was poor, no evaluation was possible whereby it was judged that the evaluation was not possible.

Evaluation result was mentioned in accordance with the following criteria.

∘: a case wherein, in both of the samples A and B, the peeling-off was not confirmed in the relief image
x: a case wherein, although the peeling-off of the relief image was not confirmed in the sample A, the peeling-off of the relief image was confirmed in the sample B
xx: a case wherein, in both of the samples A and B, the evaluation was "x" in the relief reproducibility evaluation or, in both of the samples A and B, the peeling-off of the relief image was confirmed Evaluation for Relief Hardness The photosensitive resin composition was sandwiched between two sheets of polyester film of 125 µm thickness, and the resulting laminate was subjected to a heating/pressing machine heated to 109° C., whereby a sheet of photosensitive resin was prepared. This sheet (sheet-like laminate) has a total thickness of 1250 µm. The photosensitive resin layer has a thickness of 100 µm. Then, each of the polyester film surface was irradiated with an active ray (light source: Philips 10 R; illuminance at 365 nm: 9 mW/cm$^2$) from a position at a distance of 5 cm height from a surface of the photosensitive resin sheet with an exposing time by which a step guide showed 16 steps. Then, the two sheets of polyester film were removed. From the photosensitive resin layer after photo-cure, sample pieces (3 cm×3 cm squares) were cut off. Six sample pieces were layered one after another so as to prepare a sample for hardness measurement. Shore A hardness of the sample was measured at a room temperature (25° C.) using a Shore type durometer (Shore A type) manufactured by Zwick (West Germany).

TABLE 1

| ingredient of photosensitive resin composition | | Example 1 | Example 2 | Example 3 | Example 4 | Example 5 |
|---|---|---|---|---|---|---|
| polymer compound (a) | polymer compound 1 | 55 | 55 | 55 | 55 | 55 |
| | polymer compound 2 | | | | | |
| | polymer compound 3 | | | | | |
| | NBR latex | | | | | |
| cross-linking agent (b) | adduct of propylene glycol diglycidyl ether with acrylic acid | 28 | 28 | 28 | 28 | 29.7 |
| | adduct of glycerine diglycidyl ether with acrylic acid | | | | | |
| photo-polymerization initiator (c) | benzyl dimethylketal | 1 | 1 | 1 | 1 | 1 |
| | sorbitan monooleate | | | | 2 | 1 |
| | sorbitan monostearate | | | 2 | | 0.3 |
| | glycerol monocaprate | | | | | |
| | glycerol monomyristate | | | | | |
| | glycerol monolaurate | | | | | |
| | glycerol monopalmitate | | | | | |
| | glycerol monostearate | | | | | |
| | glycerol monobehenate | | 2 | | 1 | |
| | glycerol monolignocerate | | | | | |
| fatty acid ester | myristyl myristate | | | | | |
| fatty acid | stearic acid | | | | | |
| plasticizer | N-ethyl-toluenesulfonic amide | 9 | 9 | 9 | 9 | 9 |
| | diethylene glycol | | | | | |
| | 1,2-butanediol | | | | | |
| acid | lactic acid | 5 | 5 | 5 | 5 | 5 |
| plate property evaluation | developing property (developing time) | ∘ (120 seconds) | ∘ (120 seconds) | ∘ (120 seconds) | ∘ (125 seconds) | ∘ (120 seconds) |
| | relief image reproducibility | ∘ | ∘ | ∘ | ∘ | ∘ |
| adhesive property evaluation | spherical body-rolling evaluation | ∘ (1 second) | ∘ (3 seconds) | ∘ (4 seconds) | Δ (4 seconds) | Δ (9 seconds) |
| | printing property evaluation | ∘ (1) | ∘ (2) | ∘ (3) | ∘ (3) | Δ (8) |
| storing stability evaluation | bleeding-out | ∘ | ∘ | ∘ | ∘ | ∘ |
| | adhesive property | ∘ | ∘ | ∘ | ∘ | ∘ |
| relief hardness | shore A hardness | 83 | 83 | 83 | 83 | 84 |

| ingredient of photosensitive resin composition | | Example 6 | Example 7 | Example 8 | Example 9 | Example 10 |
|---|---|---|---|---|---|---|
| polymer compound (a) | polymer compound 1 | 55 | 55 | 55 | | |
| | polymer compound 2 | | | | 55 | |
| | polymer compound 3 | | | | | 55 |
| | NBR latex | | | | | |

TABLE 1-continued

| ingredient of photosensitive resin composition | | | | | | |
|---|---|---|---|---|---|---|
| cross-linking agent (b) | adduct of propylene glycol diglycidyl ether with acrylic acid | 29.4 | 29 | 27 | 28 | 28 |
| | adduct of glycerine diglycidyl ether with acrylic acid | | | | | |
| photo-polymerization initiator (c) | benzyl dimethylketal | 1 | 1 | 1 | 1 | 1 |
| | sorbitan monooleate | 0.6 | 1 | 5 | 2 | 2 |
| | sorbitan monostearate | | | | | |
| | glycerol monocaprate | | | | | |
| | glycerol monomyristate | | | | | |
| | glycerol monolaurate | | | | | |
| | glycerol monopalmitate | | | | | |
| | glycerol monostearate | | | | | |
| | glycerol monobehenate | | | | | |
| | glycerol monolignocerate | | | | | |
| fatty acid ester | myristyl myristate | | | | | |
| fatty acid | stearic acid | | | | | |
| plasticizer | N-ethyl-toluenesulfonic amide | 9 | 9 | 7 | 9 | 9 |
| | diethylene glycol | | | | | |
| | 1,2-butanediol | | | | | |
| acid | lactic acid | 5 | 5 | 5 | 5 | 5 |
| plate property evaluation | developing property (developing time) | ° (120 seconds) | ° (120 seconds) | ° (120 seconds) | ° (120 seconds) | ° (120 seconds) |
| | relief image reproducibility | ° | ° | ° | ° | ° |
| adhesive property evaluation | spherical body-rolling evaluation | Δ (6 seconds) | Δ (4 seconds) | ° (2 seconds) | ° (3 seconds) | ° (3 seconds) |
| | printing property evaluation | ° (4) | ° (3) | ° (2) | ° (2) | ° (2) |
| storing stability evaluation | bleeding-out | ° | ° | ° | ° | ° |
| | adhesive property | ° | ° | ° | ° | ° |
| relief hardness | shore A hardness | 84 | 83 | 84 | 84 | 85 |

| ingredient of photosensitive resin composition | | Example 11 | Example 12 | Example 13 | Comparative Example 1 | Comparative Example 2 |
|---|---|---|---|---|---|---|
| polymer compound (a) | polymer compound 1 | 50 | 50 | 50 | 55 | 55 |
| | polymer compound 2 | | | | | |
| | polymer compound 3 | | | | | |
| | NBR latex | | | | | |
| cross-linking agent (b) | adduct of propylene glycol diglycidyl ether with acrylic acid | | | | 28 | 28 |
| | adduct of glycerine diglycidyl ether with acrylic acid | 30 | 31 | 29 | | |
| photo-polymerization initiator (c) | benzyl dimethylketal | 1 | 1 | 1 | 1 | 1 |
| | sorbitan monooleate | | | | | |
| | sorbitan monostearate | 5 | 4 | 6 | | |
| | glycerol monocaprate | | | | | |
| | glycerol monomyristate | | | | | |
| | glycerol monolaurate | | | | | |
| | glycerol monopalmitate | | | | | |
| | glycerol monostearate | | | | | |
| | glycerol monobehenate | | | | | |
| | glycerol monolignocerate | | | | | |
| fatty acid ester | myristyl myristate | | | | | |
| fatty acid | stearic acid | | | | | 3 |
| plasticizer | N-ethyl-toluenesulfonic amide | 9 | | | 11 | 9 |
| | diethylene glycol | | 9 | | | |
| | 1,2-butanediol | | | 9 | | |
| acid | lactic acid | 5 | 5 | 5 | 5 | 4 |
| plate property evaluation | developing property (developing time) | ° (120 seconds) | ° (120 seconds) | ° (120 seconds) | ° (120 seconds) | ° (120 seconds) |
| | relief image reproducibility | ° | ° | ° | ° | ° |
| adhesive property evaluation | spherical body-rolling evaluation | ° (2 seconds) | ° (3 seconds) | ° (2 seconds) | x (50 seconds) | ° (1 second) |
| | printing property evaluation | ° (3) | ° (2) | ° (2) | x (60) | ° (1) |
| storing stability evaluation | bleeding-out | ° | ° | ° | ° | x |
| | adhesive property | ° | ° | ° | ° | x |
| relief hardness | shore A hardness | 83 | 79 | 78 | 81 | 83 |

| ingredient of photosensitive resin composition | | Comparative Example 3 | Comparative Example 4 | Comparative Example 5 | Comparative Example 6 | Comparative Example 7 |
|---|---|---|---|---|---|---|
| polymer compound (a) | polymer compound 1 | | 55 | 55 | 55 | |
| | polymer compound 2 | 55 | | | | |
| | polymer compound 3 | | | | | |
| | NBR latex | | | | | 55 |
| cross-linking agent (b) | adduct of propylene glycol diglycidyl ether with acrylic acid | 28 | 28 | 28 | 25 | 28 |
| | adduct of glycerine diglycidyl ether with acrylic acid | | | | | |

TABLE 1-continued

| | | | | | | |
|---|---|---|---|---|---|---|
| photo-polymerization initiator (c) | benzyl dimethylketal | 1 | 1 | 1 | 1 | 1 |
| | sorbitan monooleate | | | | 8 | 2 |
| | sorbitan monostearate | | | 2 | | |
| | glycerol monocaprate | | | | | |
| | glycerol monomyristate | | | | | |
| | glycerol monolaurate | | | | | |
| | glycerol monopalmitate | | | | | |
| | glycerol monostearate | | | | | |
| | glycerol monobehenate | | | | | |
| | glycerol monolignocerate | | | 2 | | |
| fatty acid ester | myristyl myristate | 3 | | | | |
| fatty acid | stearic acid | | | | | |
| plasticizer | N-ethyl-toluenesulfonic amide | 9 | 9 | 9 | 6 | 9 |
| | diethylene glycol | | | | | |
| | 1,2-butanediol | 4 | 5 | 5 | 5 | 5 |
| acid | lactic acid | | | | | |
| plate property evaluation | developing property (developing time) | ° (120 seconds) | ° (120 seconds) | ° (120 seconds) | ° (120 seconds) | xx |
| | relief image reproducibility | x | x | ° | x | ° |
| adhesive property evaluation | spherical body-rolling evaluation | ° (1 second) | ° (1 second) | x (16 seconds) | ° (1 second) | x (90 seconds) |
| | printing property evaluation | ° (1) | ° (1) | x (20) | ° (1) | x (90) |
| storing stability evaluation | bleeding-out | x | x | ° | ° | ° |
| | adhesive property | evaluation impossible | evaluation impossible | ° | evaluation impossible | xx |
| relief hardness | shore A hardness | 84 | 83 | 83 | 85 | 70 |

| ingredient of photosensitive resin composition | | Referential Example 1 | Referential Example 2 | Referential Example 3 | Referential Example 4 |
|---|---|---|---|---|---|
| polymer compound (a) | polymer compound 1 | 55 | 55 | 55 | 55 |
| | polymer compound 2 | | | | |
| | polymer compound 3 | | | | |
| | NBR latex | | | | |
| cross-linking agent (b) | adduct of propylene glycol diglycidyl ether with acrylic acid | 28 | 28 | 28 | 28 |
| | adduct of glycerine diglycidyl ether with acrylic acid | | | | |
| photo-polymerization initiator (c) | benzyl dimethylketal | 1 | 1 | 1 | 1 |
| | sorbitan monooleate | | | | |
| | sorbitan monostearate | | | | |
| | glycerol monocaprate | | | | |
| | glycerol monomyristate | | | | 2 |
| | glycerol monolaurate | | | 2 | |
| | glycerol monopalmitate | | 2 | | |
| | glycerol monostearate | 2 | | | |
| | glycerol monobehenate | | | | |
| | glycerol monolignocerate | | | | |
| fatty acid ester | myristyl myristate | | | | |
| fatty acid | stearic acid | | | | |
| plasticizer | N-ethyl-toluenesulfonic amide | 9 | 9 | 9 | 9 |
| | diethylene glycol | | | | |
| | 1,2-butanediol | | | | |
| acid | lactic acid | 5 | 5 | 5 | 5 |
| plate property evaluation | developing property (developing time) | ° (120 seconds) | ° (120 seconds) | ° (120 seconds) | ° (120 seconds) |
| | relief image reproducibility | ° | ° | ° | ° |
| adhesive property evaluation | spherical body-rolling evaluation | ° (1 second) | Δ (4 seconds) | Δ (7 seconds) | Δ (9 seconds) |
| | printing property evaluation | ° (1) | ° (3) | ° (4) | Δ (7) |
| storing stability evaluation | bleeding-out | ° | ° | ° | ° |
| | adhesive property | ° | ° | ° | ° |
| relief hardness | shore A hardness | 83 | 83 | 83 | 83 |

| Compound name | Number of hydroxyl groups | Number of carbon atoms |
|---|---|---|
| sorbitan monooleate | 3 | 24 |
| sorbitan monostearate | 3 | 24 |
| glycerol monocaprate | 2 | 13 |
| glycerol monomyristate | 2 | 17 |
| glycerol monolaurate | 2 | 15 |
| glycerol monopalmitate | 2 | 19 |
| glycerol monostearate | 2 | 21 |
| glycerol monobehenate | 2 | 25 |
| glycerol monolignocerate | 2 | 27 |

It is apparent from Table 1 that all of Examples 1 to 13 being within a range of the present invention are excellent in all terms of the plate property (developing property and relief image reproducibility), the adhesive property evaluation (spherical body-rolling evaluation and printing property evaluation) and the storing stability evaluation (bleeding-out; adhesive property). On the contrary, Comparative Example 1 containing no fatty acid ester (ingredient (d)) is inferior in the adhesive property evaluation (spherical body-rolling evaluation and printing property evaluation). Comparative Example 2 containing a fatty acid as the same as in Patent Document 3 in place of the fatty acid ester (ingredient (d)) is inferior in the storing stability evaluation (bleeding-out; adhesive property). Comparative Example 3 having no hydroxyl group in a molecule and containing a fatty acid ester with too many carbon numbers in place of the fatty acid ester (ingredient (d)) is inferior in the storing stability evaluation (bleeding-out; adhesive property). Comparative Example 4 wherein carbon numbers of the fatty acid ester (ingredient d)) are too many is inferior in the relief image reproducibility and the storing stability evaluation (bleeding-out; adhesive property). Comparative Example 5 wherein carbon numbers of the fatty acid ester (ingredient (d)) are too small is inferior in the adhesive property evaluation (spherical body-rolling evaluation and printing property evaluation). Comparative Example 6 wherein the amount of the fatty acid ester (ingredient (d)) is too high is inferior in the relief image reproducibility and the adhesive property. Comparative Example 7 containing the latex in place of the polyamide and/or polyamide block copolymer (ingredient (a)) is inferior in the developing property, the adhesive property evaluation (spherical body-rolling evaluation and property evaluation) and the adhesive property.

In view of the relief hardness, Examples 12 and 13 using diethylene glycol or 1,2-butanediol as a plasticizer exhibit low shore A hardness compared with Examples 1 to 11 using other plasticizer, and thus Examples 12 and 13 are excellent in flexibility.

Referential Examples 1 to 4 correspond to Examples 2 to 5 of PCT/JP2017/00672 Which was filed by the same Applicant as the present application. Referential Examples 1 to 4 correspond to a case wherein the fatty acid ester (d) has two or more hydroxyl groups and 21, 19, 15 or 17 carbon atoms in a molecule, and wherein the fatty acid ester (d) is a fatty acid ester of a compound selected from fatty acids having a number of carbon atoms of 18, 16, 12 or 14. Similar to Examples 1 to 11, Referential Examples 1 to 4 are excellent in all terms of the plate property (developing property and relief image reproducibility), the adhesive property evaluation (spherical body-rolling evaluation and printing property evaluation) and the storing stability evaluation (bleeding-out; adhesive property).

In the international search report of the above prior application, lack of support was pointed out. In response thereto, the Applicant excluded, from the right range of PCT/JP2017/005672, a case wherein the fatty acid ester (d) has two or more hydroxyl groups and 24 or 25 carbon atoms in a molecule, and wherein the fatty acid ester (d) is a fatty acid ester of a compound selected from fatty acids having a number of carbon atoms of 12 to 22. In the present application, the Applicant tries to obtain a right to the above case.

INDUSTRIAL APPLICABILITY

In accordance with the present invention, it is now possible to prepare a relief wherein the adhesive property on the surface is made low in spite of the resin plate having a long-term storing stability. Further, it is possible to reduce the disadvantages during the printing step. It is also very easy to enhance the printing quality. Consequently, the present invention is expected to greatly contribute in the industrial world.

The invention claimed is:

1. A water-developable photosensitive resin composition for flexographic printing, comprising at least a polyamide and/or a polyamide block copolymer (a), a cross-linking agent having one or more unsaturated group(s) (b), a photo-polymerization initiator (c), and a fatty acid ester (d),
wherein the fatty acid ester (d) has two or more hydroxyl groups and 24 or 25 carbon atoms in a molecule, wherein the fatty acid ester (d) is a fatty acid ester of a compound selected from fatty acids having a number of carbon atoms of 12 to 22, and wherein a content of the fatty acid ester (d) in the photosensitive resin composition is 0.2 to 6% by weight, and
wherein the water-developable photosensitive resin composition does not contain rubber component.

2. The water-developable photosensitive resin composition for flexographic printing according to claim 1, wherein the photosensitive resin composition contains 40 to 60% by weight of the polyamide and/or the polyamide block copolymer (a), 20 to 50% by weight of the cross-linking agent having one or more unsaturated group(s) (b), and 0.1 to 10% by weight of the photo-polymerization initiator (c), and wherein the polyamide and/or the polyamide block copolymer (a) contain(s), in a molecule, 50% by weight or more of a structural unit constituted from an amide bond in a block form.

3. The water-developable photosensitive resin composition for flexographic printing according to claim 1, wherein the fatty acid ester (d) is sorbitan monooleate, sorbitan monostearate or glycerol monobehenate.

4. A photosensitive resin original plate for flexographic printing, comprising a photosensitive resin layer constituted from the water-developable photosensitive resin composition for flexographic printing according to claim 1, a support and an adhesive layer for adhering them.

5. The photosensitive resin original plate for flexographic printing according to claim 4, in combination with a UV ink or a UV varnish.

6. The water-developable photosensitive resin composition for flexographic printing according to claim 1, wherein the content of the fatty acid ester (d) in the photosensitive resin composition is 4 to 6% by weight.

* * * * *